United States Patent [19]

McDevitt, Jr. et al.

[11] 4,401,353

[45] Aug. 30, 1983

[54] PROGRAMMABLE PLUG

[75] Inventors: John E. McDevitt, Jr., Cumberland, R.I.; Richard W. Petersen, Taunton, Mass.

[73] Assignee: Augat Inc., Mansfield, Mass.

[21] Appl. No.: 291,807

[22] Filed: Aug. 10, 1981

[51] Int. Cl.³ ............................................. H01R 31/08
[52] U.S. Cl. ................................. 339/18 C; 339/218 R
[58] Field of Search ................. 339/18 R, 18 B, 18 C, 339/18 P, 222, 218

[56] References Cited

U.S. PATENT DOCUMENTS

| 2,874,313 | 2/1959 | Githens | 339/18 R X |
| 3,935,372 | 1/1976 | Triplett et al. | 339/18 C X |
| 4,030,793 | 6/1977 | Hanlon et al. | 339/18 C X |

*Primary Examiner*—Mark Rosenbaum
*Attorney, Agent, or Firm*—Weingarten, Schurgin, Gagnebin & Hayes

[57] ABSTRACT

A programmable plug providing selectable interconnections between any terminal pin of the plug and any one or more other pins. The programmable plug comprises an insulating body having an array of electrical terminals each having a pin portion outwardly extending from the body for insertion into an associated socket contact, and a contact pad portion on the top surface of the body. A plurality of posts are provided on the top surface of the body, each being longitudinally disposed between adjacent pad portions and laterally disposed between rows of pads, the posts defining selectable paths for electrical wire connection from any pad to any other pad.

12 Claims, 6 Drawing Figures

PROGRAMMABLE PLUG

FIELD OF THE INVENTION

This invention relates to electrical interconnection apparatus, and more particularly to a programmable plug for selectable interconnection of the terminal pins of the plug.

BACKGROUND OF THE INVENTION

Programmable plugs are known for the selective interconnection of electrical terminals of a terminal array to provide an intended interconnection pattern. Often such plugs are in the form of a dual-in-line package which is insertable into a dual-in-line socket or printed circuit solder pads provided on a circuit board. A dual-in-line programmable plug is shown in U.S. Pat. No. 4,030,793, assigned to the assignee of this invention, in which preformed jumper connections can be mounted in associated slots of the plug body for selective interconnection of the terminal pins, and to provide corresponding electrical interconnection of socket contacts of a dual-in-line terminal array into which the plug is inserted. The slots are arranged in a rectangular grid between the terminals, and interconnection is via the preformed jumper connections which are fitted into the slots to provide the intended interconnect pattern. A dual-in-line programmable plug is also known in which adjacent pins and opposing pins are all initially interconnected, with an intended interconnect pattern being provided by selective removal of sections between adjacent and opposing pins.

These known types of programmable plugs are limited to electrical connection in a rectangular pattern between adjacent pins and opposing pins, and do not provide means by which interconnecting paths can cross one another. Crossed wire paths are generally provided in programmable plugs of prior configuration by hand wiring, which is both expensive and time-consuming. The hand wiring of a plug can take a matter of minutes for an operator to perform.

SUMMARY OF THE INVENTION

In accordance with this invention, a programmable plug is provided by which wire interconnections are easily and selectably provided between any terminal pin of the plug to any one or more other pins, preferably by automatic flexible wiring apparatus. The novel programmable plug comprises an electrically insulative body containing an array of electrical terminals secured therein, each terminal having a pin portion outwardly extending from the body for insertion into the socket contacts or solder pads of a circuit board, and a contact pad portion disposed on the top surface of the body, and a plurality of posts upstanding from the top surface in spaced arrangement along the body. The contact pads are arranged in a rectangular grid pattern composed of two or more rows of spaced pads, or in a linear array or single row of spaced pads. Each of the posts is longitudinally disposed between adjacent pads of a row and laterally disposed between the rows. The opposing pads of respective rows define a path for direct electrical connection by means of a wire therebetween. The adjacent pads of each row and the intermediate posts define a path therebetween for electrical wire connection from one of the pads around the intermediate post to the adjacent pad. The posts define selectable paths for electrical wire connection from any pad to any other pads.

DESCRIPTION OF THE DRAWINGS

The invention will be more fully understood from the following detailed description taken in conjunction with the accompanying drawings, in which.

DETAILED DESCRIPTION OF THE INVENTION

Figure 1:
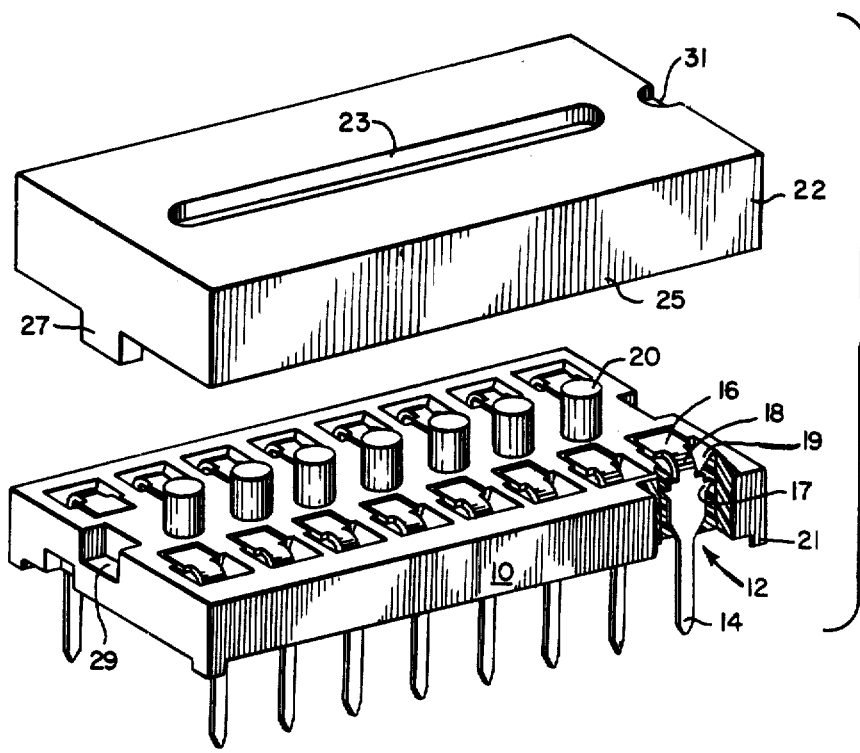
FIG. 1 is a pictorial view of a programmable plug in accordance with the invention.

The programmable plug constructed in accordance with the invention will be described in relation to an exemplary embodiment of dual-in-line configuration depicted in FIG. 1. The plug includes a body 10 of electrically insulative material of generally flat rectangular configuration and having a plurality of electrical terminals 12 secured in the body in a dual-in-line configuration. Each terminal 12 includes a pin portion 14 outwardly from the bottom surface of the body in dual-in-line configuration for insertion into a corresponding array of socket contacts or printed circuit solder pads disposed on a circuit board with which the programmable plug is to be employed. The terminals also include respective contact pads 16 disposed in dual-in-line configuration on the top surface of the body. The pads 16 are joined to the portion of the terminals extending through the plug body by a constricted path 18 to minimize heat loss from the pads when soldering or otherwise thermally connecting a wire to the pad. The terminals 12 each include barbs 17 which engage the confronting surfaces of the slots 19 provided in body 10 and by which the terminals are retained in the body. The pads 16 each lie within a recess in the top of body 10 to be maintained in alignment. Mounting feet 21 are provided at the corners of body 10 and which serve to engage a circuit board on which the plug is installed and to maintain clearance between the circuit board and bottom surface of the plug, as is well known.

The body includes a plurality of posts 20 integral therewith and upstanding from the top surface in spaced arrangement along the longitudinal axis of the body. Each of the posts is longitudinally disposed between adjacent pad portions of each in-line array, and is laterally disposed between the opposing arrays. After provision of an intended programming connection pattern, a cover 22 can be installed over the top surface of the body 10 to enclose the wiring thereon. The cover 22 has a bottom peripheral edge 25 which engages the confronting peripheral edge of the top surface of plug body 10 and which can be bonded thereto such as by ultrasonic or adhesive bonding. The cover includes locating tabs 27 on respective ends thereof which mate with respective recesses 29 provided in body 10. One of the tabs 27 is longer than the other and is cooperative with a deeper recess 29 to provide polarization of the cover for installation in only one predetermined position. A polarization key 31 is provided on the top of cover 22 as a visual indication of the terminal pin layout. An encapsulant can be introduced into the cover by way of a slot 23 in the top of the cover. With the cover in place on the body 10, the posts 20 are disposed in the slot, with the top surface of posts 20 flush with the top surface. A slot 27 can be provided along the bottom of the body 10 to locate the body in automated wiring or insertion apparatus.

Figure 2:
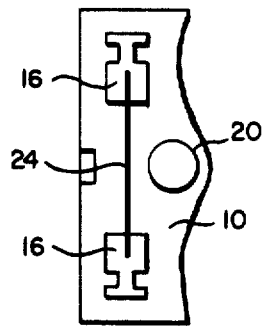
FIG. 2 is a top view of the programmable plug of FIG. 1 illustrating electrical wire interconnection between opposing terminals.
Figure 3:
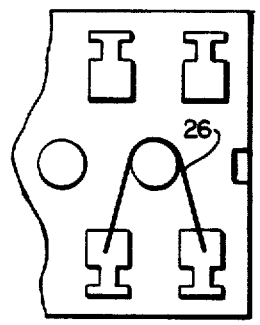
FIG. 3 is a top view of the programmable plug of FIG. 1 illustrating electrical wire interconnection between adjacent terminals.
Figure 4:
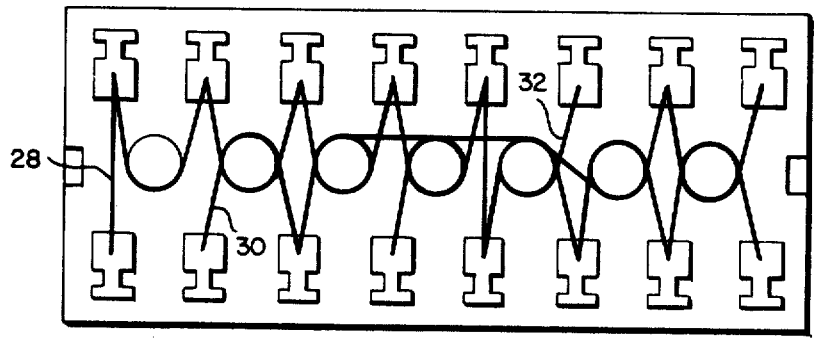
FIG. 4 is a top view of the programmable plug of FIG. 1 illustrating electrical interconnection between a plurality of adjacent and opposing terminals.

The opposing pads 16 of the two in-line arrays can be electrically interconnected by a direct wire connection 24 therebetween, as illustrated in FIG. 2. Adjacent pads 16 of each in-line array and the intermediate post 20 define a path therebetween for electrical wire connection 26 from one of the pads around the intermediate post to the adjacent pad, as illustrated in FIG. 3. The posts 20 also define selectable paths for electrical wire connection from any pad to any one or more pads of the same in-line array, and between any pad to any one or more pads of the opposing in-line array, except for the pad directly opposing that first pad. This latter selectable interconnection is illustrated in one possible wiring configuration in FIG. 4. One interconnection is provided by wire 28, a second interconnection is provided by wire 30, and a third by wire 32. The wire connections are readily made by wire bonding one end of the wire to an intended pad and extending the wire to the intended other pads to be interconnected and at which pads the wire is bonded.

Figure 5:
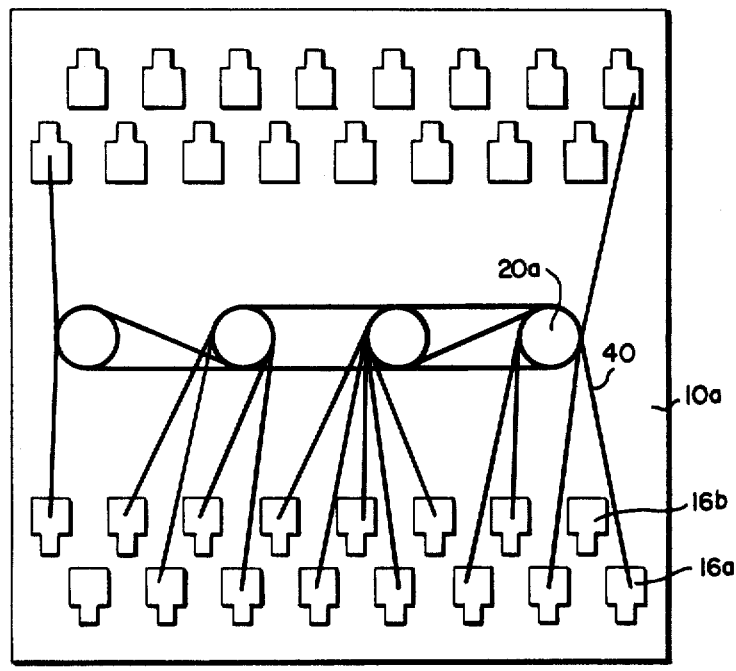
FIG. 5 is a plan view of an alternative embodiment of the programmable plug.

It will be appreciated that the invention can be embodied in plugs having contact configurations other than the dual-in-line configuration described above. An alternative embodiment is illustrated in FIG. 5 having a quad-in-line contact configuration. An array of contacts 16a is arranged along one edge of the plug body 10a. A second array of contacts 16b is arranged in offset or staggered relationship to contacts 16a. Similarly staggered arrays are provided along the opposite edge of the body. A plurality of posts 20a is provided on body 10a and upstanding from the top surface thereof. In this embodiment a post is provided between every other adjacent pair of contacts. Typical interconnection patterns are as illustrated by wires 40.

Figure 6:
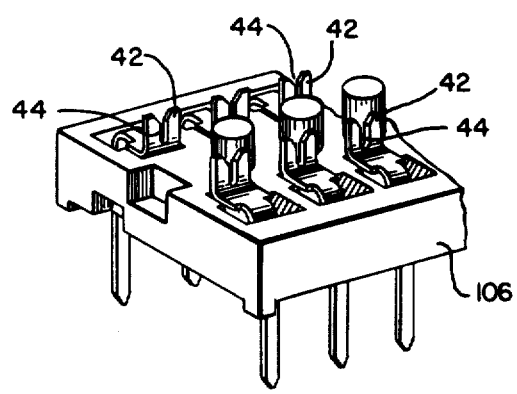
FIG. 6 is a cutaway pictorial view of a further embodiment of the programmable plug employing an insulation displacement type of contact.

A further embodiment is illustrated in FIG. 6 in which the contacts are of the insulation displacement type. Each contact is part of a terminal disposed in a plug body 10b in the manner described above, and includes a contact having an upstanding portion 42 which is slotted to receive an appropriately sized plastic or rubber insulated solid wire. Upon insertion of a wire into slot 44, the insulation is displaced or torn away by the engaging surfaces of the slot to provide electrical contact between the slot and the wire conductor. This insulation displacement type of electrical connection is itself well known.

The plug of FIGS. 1 and 5 is adapted for use with automatic point-to-point flexible wiring apparatus such as shown in U.S. Pat. Nos. 3,608,190 and 3,673,681. In using the automated flexible wiring technique of the aforesaid patents, the plug is positioned under a solder head which is adapted for relative movement among the pads 16 in a rectangular grid pattern. The solder head includes a tip through which an enameled insulated wire extends. The head is caused to contact the pad to which a wire connection is to be made, and the application of heat to the wire and pad causes vaporization of the enamel insulation on the wire and soldering of the wire to the pad. After each wire connection is made, the head is moved to the next wiring point for successive connections of an intended wiring path. After a wiring path is completed, the wire is cut from the solder head. The wiring paths which can be provided by the novel plug can cross one another and can be of any intended configuration. More than one connection can also be made to the pads. The wiring paths are not limited to a rectangular connection pattern in which connections can be made only side-to-side and end-to-end, as in prior plugs.

The plug of FIG. 6 which employs the insulation displacement type of contact can also be automatically wired by appropriate automatic point-to-point wiring systems which are adapted for use with the insulation displacement type of contact. The novel plug can also be manually programmed, although its major benefits are realized when programmed by automatic wiring apparatus.

After provision of a particular interconnection pattern, the plug can remain open, if desired, for accessibility to the wiring pattern, such as for subsequent reprogramming. Preferably the cover 22 is installed on the plug body after making an interconnection pattern, and the interior is filled via slot 23 with a suitable encapsulating material. Such encapsulation adds to the security of the device in that the particular wiring paths cannot be readily ascertained. The encapsulation also provides a rugged structure in which the wiring paths are fully insolated from the environment.

The body and cover of the novel plug are preferably molded of a suitable plastic material such as thermoplastic polyester. The terminals are typically phosphor bronze, with the contact pads having a coating of tin-lead or solder paste. In a typical embodiment the contacts are disposed on 0.100 inch centers. The dual-in-line plug of FIG. 1 typically has outside body dimensions of about 0.4 by 0.8 inch. It will be appreciated that the invention can be employed in many different plug configurations in which the contact pads are in a rectangular grid pattern having two or more rows of spaced pads or in which the contact pads are in a single linear array of spaced pads, with intermediately disposed posts. Accordingly, the invention is not to be limited by what has been particularly shown and described except as indicated in the appended claims.

What is claimed is:

1. A programmable plug operative to electrically interconnect any terminal of the plug to any other terminal thereof, the plug comprising:

a body of electrically insulative material having a top surface and a bottom surface;

a plurality of electrical terminals secured in the body, each terminal having a pin portion outwardly extending from the bottom surface of the body, and a contact pad portion disposed on the top surface of the body;

the pad portions of the terminals being arranged in at least one in-line array; and a plurality of posts on the body and upstanding from the top surface thereof in spaced arrangement substantially along the body, each of the posts being longitudinally disposed between adjacent pad portions of each in-line array, and laterally disposed between opposing arrays;

the opposing pad portions of the respective in-line arrays defining a path therebetween for direct electrical connection by means of a wire connected therebetween;

adjacent pad portions of each in-line array and an intermediate post from said plurality of posts defining a path therebetween for electrical wire connection from one of the pad portions around the post to the adjacent pad portion;

the posts defining selectable paths for electrical wire connection from any pad portion to any pad portion of the same in-line array, and to any pad portion of the other in-line array.

2. The programmable plug of claim 1 wherein the terminals each include a constricted path connecting the pad portion to the pin portion to minimize heat loss from the pad portion when soldering a wire thereto.

3. The programmable plug of claim 1 wherein said body includes a plurality of recesses in which the respective contact pad portions of the electrical terminals are disposed.

4. The programmable plug of claim 1 including a cover attachable to said body and enclosing the pad portions of said terminals and said plurality of posts.

5. The programmable plug of claim 4 wherein said cover includes means for introducing an encapsulant within the cover for encapsulating the electrical wire paths.

6. The programmable plug of claim 5 wherein said means is a slot in the cover for introducing the encapsulant.

7. The programmable plug of claim 1 wherein the electrical terminals are in dual-in-line configuration.

8. The programmable plug of claim 1 wherein the electrical terminals are in a quad-in-line configuration.

9. A programmable plug operative to electrically interconnect any terminal of the plug to any other terminal thereof, the plug comprising:

a body of electrically insulative material and of generally flat rectangular configuration having a top surface and a bottom surface;

a plurality of electrical terminals secured in the body, each terminal having a pin portion outwardly extending from the bottom surface of the body, and a contact pad portion disposed on the top surface of the body;

the pad portions of the terminals being arranged in at least one in-line array; and a plurality of posts integral with the body and upstanding from the top surface thereof in spaced arrangement substantially along a major dimension of the body, each of the posts being longitudinally disposed between adjacent pad portions of each in-line array, and laterally disposed between opposing arrays;

the opposing pad portions of the respective in-line arrays defining a path therebetween for direct electrical connection by means of a wire connected therebetween;

adjacent pad portions of each in-line array and an intermediate post from said plurality of posts defining a path therebetween for electrical wire connection from one of the pad portions around the post to the adjacent pad portion;

the posts defining selectable paths for electrical wire connection from any pad portion to any pad portion of the same in-line array, and to any pad portion of the other in-line array except for the pad portion opposing the first pad portion.

10. The programmable plug of claim 9 wherein the pad portions are arranged in a rectangular grid pattern composed of at least two rows of spaced pad portions adapted for use with automatic flexible wiring apparatus.

11. The programmable plug of claim 9 wherein the pad portions are each solder pads to which electrical wire connection is made by soldering.

12. The programmable plug of claim 9 wherein the pad portions include insulation displacement contacts.

* * * * *